United States Patent
Xu et al.

(10) Patent No.: US 9,444,321 B2
(45) Date of Patent: Sep. 13, 2016

(54) ZERO-CROSSING DETECTION CIRCUIT

(71) Applicant: Silergy Semiconductor Technology (Hangzhou) LTD, Hangzhou, ZheJiang Province (CN)

(72) Inventors: Xiaoru Xu, Hangzhou (CN); Guojia Liu, Hangzhou (CN); Jian Deng, Hangzhou (CN)

(73) Assignee: Silergy Semiconductor Technology (Hangzhou) LTD, Hangzhou (CN)

(*) Notice: Subject to any disclaimer, the term of this patent is extended or adjusted under 35 U.S.C. 154(b) by 0 days.

(21) Appl. No.: 14/604,561

(22) Filed: Jan. 23, 2015

(65) Prior Publication Data

US 2015/0214829 A1 Jul. 30, 2015

(30) Foreign Application Priority Data

Jan. 26, 2014 (CN) .......................... 2014 1 0039224

(51) Int. Cl.
| | |
|---|---|
| H02M 1/08 | (2006.01) |
| H02M 1/42 | (2007.01) |
| G01R 19/175 | (2006.01) |
| H02M 1/00 | (2006.01) |
| G01R 31/40 | (2014.01) |

(52) U.S. Cl.
CPC ............ *H02M 1/083* (2013.01); *G01R 19/175* (2013.01); *H02M 1/4258* (2013.01); *G01R 31/40* (2013.01); *H02M 2001/0009* (2013.01); *H02M 2001/0058* (2013.01); *Y02B 70/126* (2013.01); *Y02B 70/1491* (2013.01)

(58) Field of Classification Search
CPC ............. H02M 1/083; H02M 1/4258; H02M 2001/0009; H02M 2001/0058; G01R 19/175; G01R 31/40
See application file for complete search history.

(56) References Cited

U.S. PATENT DOCUMENTS

| | | | | |
|---|---|---|---|---|
| 5,469,349 | A | * 11/1995 | Marinus | H02M 3/33507 363/21.05 |
| 5,729,443 | A | * 3/1998 | Pavlin | 363/21.12 |
| 6,756,771 | B1 | 6/2004 | Ball et al. | |
| 7,426,120 | B2 | * 9/2008 | Yang | H02M 3/33523 363/20 |
| 8,736,236 | B2 | 5/2014 | Sun et al. | |
| 8,803,563 | B2 | 8/2014 | Deng et al. | |
| 2013/0241461 | A1 | 9/2013 | Huang | |
| 2014/0009080 | A1 | 1/2014 | Xu | |
| 2014/0218978 | A1* | 8/2014 | Heuken | H02M 3/33523 363/21.16 |
| 2015/0043252 | A1 | 2/2015 | Kuang | |

* cited by examiner

*Primary Examiner* — Jue Zhang

(74) *Attorney, Agent, or Firm* — Michael C. Stephens, Jr.

(57) ABSTRACT

In one embodiment, a zero-crossing detection circuit can include: (i) a first detection circuit configured to detect a current through a main transistor of a main circuit of a switching power supply, and to generate a voltage sense signal that represents the current through the main transistor; (ii) a second detection circuit configured to detect if quasi-resonance occurs in the main circuit, the second detection circuit being configured to generate at least one pulse signal when the quasi-resonance is detected; and (iii) a control circuit configured to receive the at least one pulse signal and the voltage sense signal, to turn the main transistor off when the current through the main transistor reaches a predetermined value, and to turn the main transistor on when the at least one pulse signal is active.

18 Claims, 3 Drawing Sheets

ZERO-CROSSING DETECTION CIRCUIT

RELATED APPLICATIONS

This application claims the benefit of Chinese Patent Application No. 201410039224.3, filed on Jan. 26, 2014, which is incorporated herein by reference in its entirety.

FIELD OF THE INVENTION

The present invention generally relates to the field of power electronics, and more particularly to zero-crossing detection circuitry.

BACKGROUND

Switch mode power supplies can efficiently convert electrical power from a source to a load, or to several different loads, with each corresponding to a different output. The main transistor of a switching-mode supply can switch between on and off states at a given operating frequency, and voltage regulation can be achieved by varying the ratio of the on-to-off time of the main transistor. Switch mode power supplies may have relatively high power conversion efficiency, as compared to other types of power converters. Switch mode power supplies may also be substantially smaller and lighter than a linear supply due to the smaller transformer size and weight. Switch mode power supplies can be used in many applications, such as LED driver circuits.

SUMMARY

In one embodiment, a zero-crossing detection circuit can include: (i) a first detection circuit configured to detect a current through a main transistor of a main circuit of a switching power supply, and to generate a voltage sense signal that represents the current through the main transistor; (ii) a second detection circuit configured to detect if quasi-resonance occurs in the main circuit, the second detection circuit being configured to generate at least one pulse signal when the quasi-resonance is detected; and (iii) a control circuit configured to receive the at least one pulse signal and the voltage sense signal, to turn the main transistor off when the current through the main transistor reaches a predetermined value, and to turn the main transistor on when the at least one pulse signal is active.

DETAILED DESCRIPTION

Figure 1:
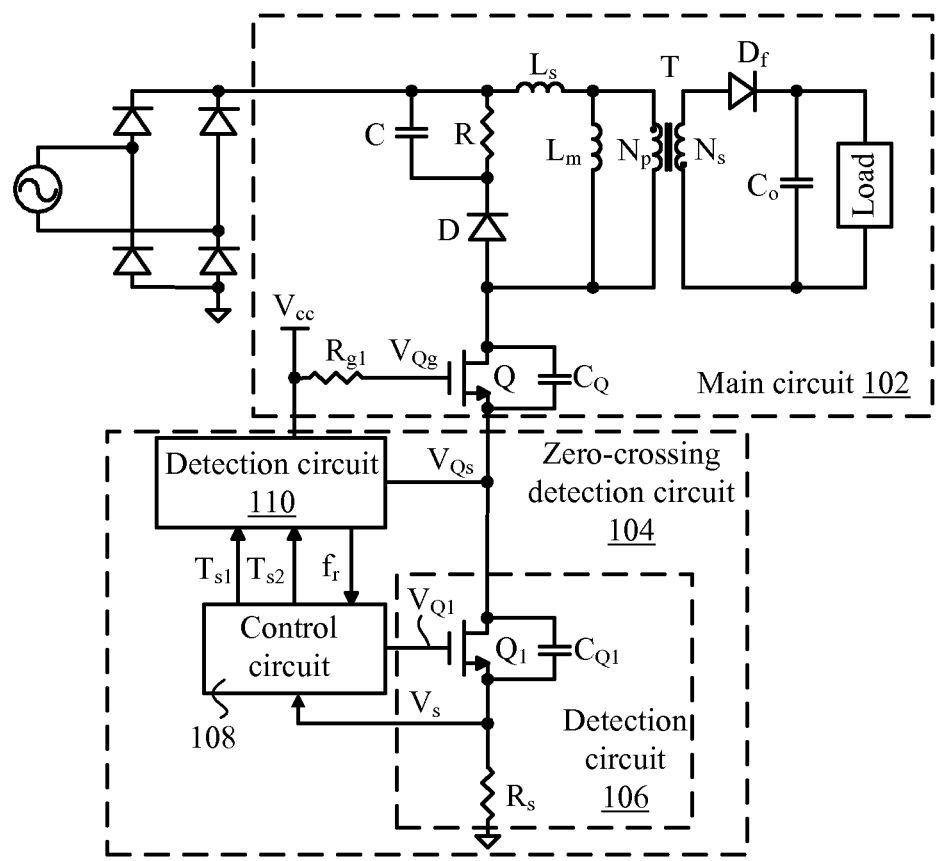
FIG. 1 is a schematic block diagram of an example zero-crossing detection circuit, in accordance with embodiments of the present invention.

Reference may now be made in detail to particular embodiments of the invention, examples of which are illustrated in the accompanying drawings. While the invention may be described in conjunction with the preferred embodiments, it may be understood that they are not intended to limit the invention to these embodiments. On the contrary, the invention is intended to cover alternatives, modifications and equivalents that may be included within the spirit and scope of the invention as defined by the appended claims. Furthermore, in the following detailed description of the present invention, numerous specific details are set forth in order to provide a thorough understanding of the present invention. However, it may be readily apparent to one skilled in the art that the present invention may be practiced without these specific details. In other instances, well-known methods, procedures, processes, components, structures, and circuits have not been described in detail so as not to unnecessarily obscure aspects of the present invention.

A switching power supply can generate a substantially stable output voltage by controlling a ratio of an on time and off time of a power switch (e.g., a power transistor) with a pulse-width modulation (PWM) control signal. Transistors (e.g., a bipolar-junction transistor [BJT], a MOS transistor, etc.) may be used as power switches in switching power supplies because of relatively low saturation voltage drop characteristics.

One type of switching power supply is a synchronous step-down converter. After a main switch (e.g., power transistor) is turned on at an initial time of each switching period, an inductor current may rise. Energy at an input terminal of the converter may be converted to magnetic energy to be stored in the inductor, and the main switch may be turned off after remaining on for a certain duty cycle. The inductor current may gradually decrease via a synchronous transistor, and the magnetic energy may be converted to electric energy to be released to an output terminal of the converter, thus completing a converter switching period. When a load (e.g., a light-emitting diode [LED], etc.) on the converter is relatively large, the inductor current may not return to zero during an entire switching cycle or period. In this case, the converter can generally operate in a continuous conduction mode (CCM). When the load is light, the inductor current may gradually decrease to zero during a "freewheeling" process of the synchronous transistor, and the synchronous transistor can be turned off. This can lower power consumption and improve conversion efficiency, and in this case, the converter can operate in a discontinuous conduction mode (DCM).

In DCM operation, a zero-crossing detection circuit may be utilized for determining whether/when the inductor current crosses zero. When the inductor current is detected to be zero by a zero-crossing comparator, the synchronous transistor may be turned off to lower power consumption, and to improve conversion efficiency. In a DC-DC converter, a zero-crossing detection circuit can be implemented by an RC differential circuit, an auxiliary winding, a float R-type circuit, and so on. When an RC differential circuit including a resistor and a capacitor coupled in series is used to detect a current, extra losses may be generated due to a current flowing through the resistor. Also, and product costs may be relatively high due to use of a high voltage capacitor to sustain a high voltage. When a zero-crossing detection circuit with an auxiliary winding is used to detect a current, circuit interference can occur, and circuit volume may be relatively high, also resulting in high product costs. When a float R-type circuit with a floated resistor is used to detect current, a control circuit applied may also be floated. As a result, the circuit can also suffer from interference, and product cost can be relatively high.

In particular embodiments, a zero-crossing detection circuit can detect if quasi-resonance occurs in a main circuit through a detection circuit. This can be based on quasi-resonance occurring when an inductor current in the main circuit crosses zero, and in response may generate a pulse at a quasi-resonance moment, in order to realize zero-crossing detection. Further, the zero-crossing detection circuit may have a relatively simple circuit structure, as well as relatively high detection precision. This approach may also have relatively low product costs as compared to circuits that directly detect the inductor current.

In one embodiment, a zero-crossing detection circuit can include: (i) a first detection circuit configured to detect a current through a main transistor of a main circuit of a switching power supply, and to generate a voltage sense signal that represents the current through the main transistor; (ii) a second detection circuit configured to detect if quasi-resonance occurs in the main circuit, the second detection circuit being configured to generate at least one pulse signal when the quasi-resonance is detected; and (iii) a control circuit configured to receive the at least one pulse signal and the voltage sense signal, to turn the main transistor off when the current through the main transistor reaches a predetermined value, and to turn the main transistor on when the at least one pulse signal is active.

Referring now to FIG. 1, shown is a schematic block diagram of an example zero-crossing detection circuit, in accordance with embodiments of the present invention. In this particular example, zero-crossing detection circuit 104 can detect if an inductor current in main circuit 102 crosses zero. In this example, main circuit 102 is a flyback circuit, and the inductor current to be detected may be a current through secondary winding $N_s$ of transformer T. When main circuit 102 is implemented in other topologies (e.g., buck, boost, etc.), zero-crossing detection circuit 104 can detect if the inductor current crosses zero.

Zero-crossing detection circuit 104 may include detection circuit 106, control circuit 108, and detection circuit 110. Detection circuit 106 can be used to detect a current through main transistor Q of main circuit 102, in order to obtain a voltage sense signal (e.g., $V_s$) that represents the current through main transistor Q. Detection circuit 110 can be used to detect if quasi-resonance occurs in main circuit 102. For example, when quasi-resonance occurs, detection circuit 110 can generate a pulse signal (e.g., pulse signals $f_r$), or a group of pulse signals.

Control circuit 108 can receive pulse signal $f_r$ and voltage sense signal $V_s$ representing a current through main transistor Q. When the current through the main transistor increases to a level of a predetermined value, control circuit 108 can turn main transistor Q off. When pulse signal $f_r$ is active, control circuit 108 can turn main transistor Q on. For example, detection circuit 106 can include transistor $Q_1$ and sampling resistor $R_s$ with a terminal coupled to ground. Transistor $Q_1$ can connect between main transistor Q and sampling resistor $R_s$.

Figure 2:
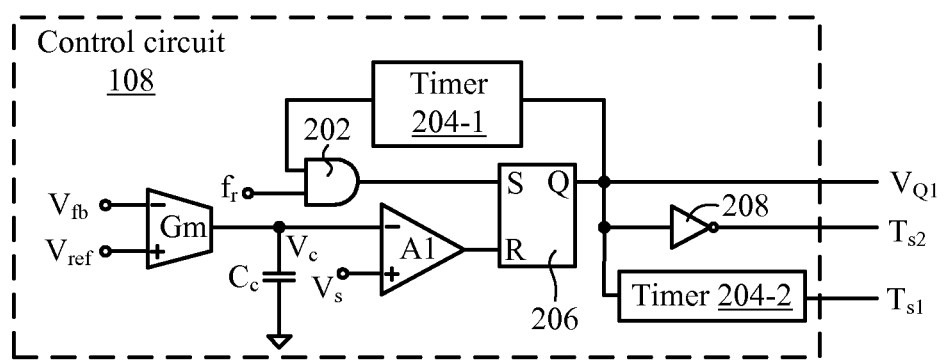
FIG. 2 is schematic block diagram of an example control circuit in a zero-crossing detection circuit, in accordance with embodiments of the present invention.

Referring now to FIG. 2, shown is schematic block diagram of an example control circuit in a zero-crossing detection circuit, in accordance with embodiments of the present invention. For example, control circuit 108 can include comparator A1 and RS flip-flop 206. Comparator A1 may have a non-inverting input terminal connected to a first terminal of sampling resistor $R_s$ for receiving voltage sense signal $V_s$, and an inverting input terminal that receives compensation voltage signal $V_c$. Also, an output terminal of comparator A1 can generate an off control signal at a reset terminal of RS flip-flop 206.

A set terminal of RS flip-flop 206 may receive an on control signal, and an output terminal can generate driving signal $V_{Q1}$ to control on/off of transistor $Q_1$. For example, when a last pulse signal (e.g., in every pulse signal group) is active, control circuit 108 can turn transistor $Q_1$ on. Control circuit 108 can also include timer 204-1 and AND-gate 202. Timer 204-1 may have an input terminal that receives driving signal $V_{Q1}$ for effectively delaying driving signal $V_{Q1}$. For example, the delay of driving signal $V_{Q1}$ can be such that a last pulse signal in a pulse signal group (e.g., a plurality of pulses) is utilized in generating a high level portion of driving signal $V_{Q1}$.

AND-gate 202 may have input terminals that connect to an output terminal of timer 204-1 and pulse signals $f_r$. An output terminal AND-gate 202 can generate the on control signal at the set terminal of RS flip-flop 206. Control circuit 108 can also include transconductance operational amplifier Gm and compensation capacitor $C_c$. Transconductance operational amplifier Gm may have an inverting input terminal for receiving feedback signal $V_{fb}$, which can represent an output voltage of main circuit 102. A non-inverting input terminal of transconductance operational amplifier Gm can receive reference voltage signal $V_{ref}$, and an output terminal can connect to the inverting input terminal of comparator A1. Compensation capacitor $C_c$ may be connected to the output terminal of transconductance operational amplifier Gm, and to ground.

Figure 3:
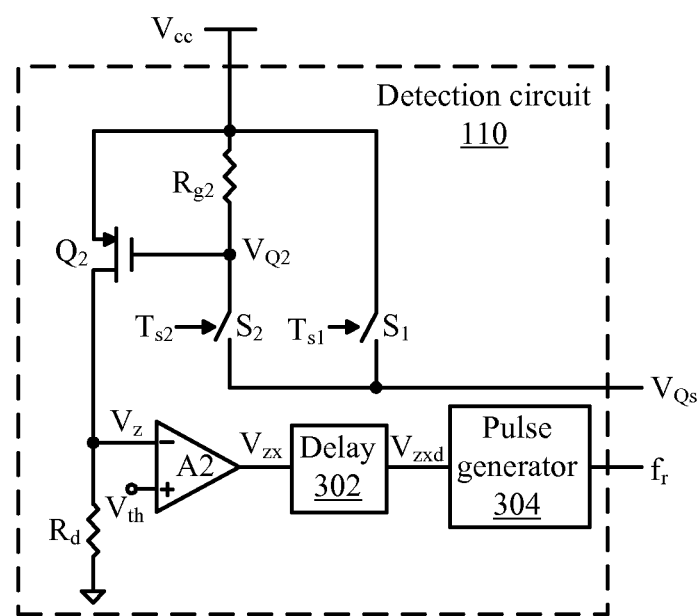
FIG. 3 is schematic block diagram of an example detection circuit in a zero-crossing detection circuit, in accordance with embodiments of the present invention.

Referring now to FIG. 3, shown is schematic block diagram of an example detection circuit in a zero-crossing detection circuit, in accordance with embodiments of the present invention. Detection circuit 110 can include driving resistor $R_{g2}$, switch $S_1$, switch $S_2$, transistor $Q_2$, detection resistor $R_d$, comparator A2, delay circuit 302, and pulse generator 304. Driving resistor $R_{g2}$ can connect to DC voltage $V_{cc}$ of main transistor Q, and to a gate of transistor $Q_2$.

Switch $S_1$ can connect to DC voltage $V_{cc}$, and to main transistor Q and transistor $Q_1$, and may receive detection signal $V_{Qs}$, which can represent a source voltage of main transistor Q. Switch $S_1$ can be controlled by switch control signal $T_{s1}$, where waveform of switch control signal $T_{s1}$ may be obtained by delaying driving signal $V_{Q1}$. Switch $S_2$ can connect to driving resistor $R_{g2}$, and to main transistor Q and transistor $Q_1$. Switch $S_2$ can be turned off by switch control signal $T_{s2}$, where the operating waveforms of switch control signal $T_{s2}$ and driving signal $V_{Q1}$ may be complementary.

A source of transistor $Q_2$ can receive DC voltage $V_{cc}$, and a drain can connect to detection resistor $R_d$. Detection resistor $R_d$ may have a first terminal for generating detection signal $V_z$, and a second terminal connected to ground. Comparator A2 may have an inverting input terminal receiving detection signal $V_z$, a non-inverting input terminal receiving threshold signal $V_{zx}$, and an output terminal generating trigger signal $V_{zx}$. Pulse generator 304 can receive trigger signal $V_{zx}$ (either directly or via delay circuit 302), and may generate pulse signal(s) $f_r$. In this particular example, transistor $Q_2$ is a P-type MOS transistor; however, other types of transistors can also be employed in certain embodiments. Detection circuit 110 can also include delay circuit 302. Delay circuit 302 can receive trigger signal $V_{zx}$, and may output delayed trigger signal $V_{zxd}$ to pulse generator 304.

Referring back to FIG. 2, control circuit 108 can also include inverter 208. Inverter 208 can connect to an output terminal of RS flip-flop 206, and can generate switch control signal $T_{s2}$, which can control on/off of switch $S_2$. Control circuit 108 may also include timer 204-2. Timer 204-2 may have an input terminal connected to an output terminal of RS flip-flop 206, and may generate switch control signal $T_{s1}$ to control on/off of switch $S_1$.

Referring back to FIG. 1, parasitic capacitors $C_Q$ and $C_{Q1}$ can connect in parallel between source and drain of main transistor Q, and the source and drain of transistor $Q_1$, respectively. Main circuit 102 can include transformer T, an RCD snubber, freewheeling diode $D_f$, output capacitor $C_o$, main transistor Q, driving resistor $R_{g1}$, and DC voltage $V_{cc}$. For example, the RCD "snubber" may be utilised to suppress voltage and/or current transients.

Transformer T can include primary winding $N_p$, secondary winding $N_s$, magnetizing inductance $L_m$, and leakage inductance $L_s$. The RCD snubber can connect to primary winding $N_p$ of transformer T, and magnetizing inductance $L_m$ can connect to primary winding $N_p$ in parallel. Leakage inductance $L_s$ may have a first terminal for receiving a DC input voltage of main circuit 102, and a second terminal connected to a first terminal of magnetizing inductance $L_m$.

The RCD snubber can include capacitor C, resistor R, and clamping diode D. Capacitor C and resistor R can connect in parallel with a first common node coupled to a first terminal of leakage inductance $L_s$, and a second common node coupled to a cathode of clamping diode D. An anode of clamping diode D can connect to a second terminal of magnetizing inductance $L_m$. Secondary winding $N_s$ of transformer T, freewheeling diode $D_f$, and output capacitor $C_o$ can be coupled in a loop, and a load (e.g., an LED load) can connect across terminals of output capacitor $C_o$.

Main transistor Q may have a drain connected to a second terminal of magnetizing inductance $L_m$, a source connected to zero-crossing detection circuit 104, and a gate connected to a first terminal of driving resistor $R_{g1}$. A second terminal of driving resistor $R_{g1}$ can connect to DC voltage $V_{cc}$. For example, a DC voltage input circuit of main circuit 102 can include an AC voltage source and a rectifier bridge, as shown. An AC voltage output from the AC voltage source can be rectified by the rectifier bridge.

An output terminal of the rectifier bridge can generate a DC input voltage provided to the main circuit 102. The positive end of the DC input voltage can connect to the first terminal of leakage inductance $L_s$, and a negative end can connect to ground. Referring to FIGS. 1-3, when main transistor Q and transistor $Q_1$ are turned on, primary winding $N_p$ of transformer T in main circuit 102 can begin storing energy. The inverting input terminal of transconductance operational amplifier Gm can receive feedback signal $V_{fb}$, which may represent the output voltage of the main circuit 102 (e.g., $V_{fb}$ is a dividing signal of the output voltage). Also, the non-inverting input terminal of transconductance operational amplifier Gm can reference voltage signal $V_{ref}$.

When the load at the output terminal of the main circuit 102 is relatively heavy, $V_{fb}$ may be less than $V_{ref}$. In this case, the current generated by transconductance operational amplifier Gm can charge compensation capacitor $C_c$, and a voltage across compensation capacitor (e.g., compensation voltage signal $V_c$) may be positive. Sampling resistor $R_s$ can sense the current through main transistor Q, in order to generate voltage sense signal $V_s$. Thus, voltage sense signal $V_s$ can represent the current through main transistor Q. When $V_s$ increases (e.g., linearly) to reach a level of $V_c$, comparator A1 can output a high level, RS flip-flop 206 can be reset, and driving signal $V_{Q1}$ output from RS flip-flop 206 can go low to turn off $Q_1$.

When driving signal $V_{Q1}$ is low, switch control signal $T_{s1}$ generated by timer 204-2 can be high, and switch control signal $T_{s2}$ generated via inverter 208 may also be at a high level. When switch control signals $T_{s1}$ and $T_{s2}$ received by detection circuit 110 are high, switches $S_1$ and $S_2$ can be on. In this case, the voltage of detection signal $V_{Qs}$ representing the source voltage of main transistor Q can be equal to DC voltage $V_{cc}$, and the voltage of driving signal $V_{Q2}$ of transistor $Q_2$ can be equal to that of detection signal $V_{Qs}$. Thus, driving signal $V_{Q2}$ may be equal to DC voltage $V_{cc}$, and transistor $Q_2$ can be turned on.

As the voltage of detection signal $V_{Qs}$ equals DC voltage $V_{cc}$, the gate-source voltage ($V_{Qg}$-$V_{Qs}$) of main transistor Q may be almost zero, too low to supply a driving voltage, and main transistor Q may be off. As a result, the current through main transistor Q can be zero, and $V_s$ may be zero. In this case parasitic capacitors $C_Q$ and $C_{Q1}$ respectively connected in parallel with main transistor Q and transistor $Q_1$ can be in resonance with leakage inductance $L_s$, in order to generate a resonance current.

The inductor current through secondary winding $N_s$ of transformer T can cross zero, the primary side circuit can begin to resonate, and current can flow through parasitic capacitor $C_Q$, transistor $Q_2$, and detection resistor $R_d$. Detection signal $V_z$ can detect the current through transistor $Q_2$ by detection resistor $R_d$, which can be the current through parasitic capacitor $C_Q$ of main transistor Q under a resonant state. For example, transistor $Q_2$ can be implemented by a P-type MOS transistor; however, other types of transistors can also be employed in certain embodiments.

Comparator A2 may have an inverting input terminal that receives detection signal $V_z$, and a non-inverting input terminal that receives threshold signal $V_{th}$. When $V_z$ is less than $V_{th}$, the primary-side circuit of transformer T can be in a resonant state. Parasitic capacitor $C_Q$ connected in parallel with main transistor Q can be in resonance with leakage inductance $L_s$, trigger signal $V_{zx}$ output from comparator A2 can be high, and delayed trigger signal $V_{zxd}$ can also be high. When $V_{zxd}$ is at a high level, pulse signal generator 304 can generate pulse signal $f_r$. When $V_{zxd}$ again goes high, pulse generator 304 can generate another pulse signal $f_r$. Thus, a pulse group or plurality of pulses can be generated by pulse generated 304.

Control circuit 108 can receive pulse signal(s) $f_r$ triggered during the resonance state. Driving signal $V_{Q1}$ can be processed by timer 204-1, and then by a logical AND operation with pulse signal(s) $f_r$. When both signals are high, RS flip-flop 206 can be set, and $V_{Q1}$ may transition to a high level to turn on transistor $Q_1$. Thus, the voltage of detection signal $V_{Qs}$ can be equal to zero, transistor $Q_2$ can be turned off, and main transistor control signal $V_{Qg}$ at the gate of main transistor Q can be equal to $V_{cc}$. Therefore, main transistor Q can also be turned on, and voltage sense signal $V_s$ can begin increasing to reach a level of $V_c$, which may result in $V_{Q1}$ again going low. In this way, by repeating the above-described operation process, zero-crossing detection of main circuit 102 can be realized.

The embodiments were chosen and described in order to best explain the principles of the invention and its practical applications, to thereby enable others skilled in the art to best utilise the invention and various embodiments with modifications as are suited to particular use(s) contemplated. It is intended that the scope of the invention be defined by the claims appended hereto and their equivalents.

What is claimed is:

1. A zero-crossing detection circuit, comprising:
  a) a first detection circuit configured to detect a current through a main transistor of a main circuit of a switching power supply, and to generate a voltage sense signal that represents said current through said main transistor, wherein said first detection circuit comprises a first transistor that is coupled to a source of said main transistor;

b) a second detection circuit configured to detect if quasi-resonance occurs in said main circuit, said second detection circuit being configured to generate at least one pulse signal when said quasi-resonance is detected; and c) a control circuit configured to receive said at least one pulse signal and said voltage sense signal, to turn said main transistor off when said current through said main transistor reaches a predetermined value, and to turn said main transistor on by turning said first transistor on when said at least one pulse signal is active.

2. The zero-crossing detection circuit of claim 1, wherein said first detection circuit comprises a sampling resistor coupled between said first transistor and ground.

3. The zero-crossing detection circuit of claim 2, wherein said control circuit comprises:

a) a first comparator having a non-inverting input terminal coupled to receive said voltage sense signal across said sampling resistor, an inverting input terminal coupled to receive a compensation voltage signal, and an output terminal configured to generate an off control signal; and b) an RS flip-flop having a reset terminal coupled to receive said off control signal, a set terminal coupled to receive an on control signal, and an output terminal configured to generate a first driving signal to control said first transistor.

4. The zero-crossing detection circuit of claim 3, wherein said control circuit is configured to turn said first transistor on in response to a last of said at least one pulse signal.

5. The zero-crossing detection circuit of claim 4, wherein said control circuit further comprises:

a) a first timer configured to delay said first driving signal such that only a last pulse signal of said at least one pulse signal is in a high level portion of said first driving signal; and b) an AND-gate having input terminals coupled to an output terminal of said first timer and said at least one pulse signal, and an output terminal configured to generate said on control signal.

6. The zero-crossing detection circuit of claim 3, wherein said control circuit further comprises:

a) a transconductance operational amplifier having an inverting input terminal configured to receive a feedback signal, a non-inverting input terminal configured to receive a reference voltage signal, and an output terminal coupled to said non-inverting input terminal of said first comparator; and b) a compensation capacitor having a first terminal coupled to said output terminal of said transconductance operational amplifier, and a second terminal coupled to ground.

7. The zero-crossing detection circuit of claim 3, wherein said second detection circuit comprises:

a) a driving resistor having a first terminal coupled to a DC voltage supply of said main transistor, and a second terminal coupled to a gate of a second transistor;

b) a first switch having a first terminal coupled to said DC voltage supply, and a second terminal coupled to said main transistor and said first transistor and configured to receive said first detection signal, wherein said first switch is controllable by a first switch control signal;

c) a second switch having a first terminal coupled to said second terminal of said driving resistor, and a second terminal coupled to said main transistor and said first transistor, wherein said second switch is controllable by a second switch control signal, wherein said second switch control signal and said first driving signal are complementary;

d) said second transistor having a source configured to receive said DC voltage supply, and a drain coupled to said first terminal of a detection resistor, said detection resistor having a first terminal configured to generate said second detection signal, and a second terminal coupled to ground;

e) a second comparator having an inverting input terminal configured to receive said second detection signal, a non-inverting input terminal configured to receive a threshold signal, and an output terminal configured to generate a trigger signal; and f) a pulse generator having an input terminal configured to receive said trigger signal, and an output terminal configured to generate said at least one pulse signal.

8. The zero-crossing detection circuit of claim 7, wherein said second detection circuit further comprises a delay circuit having an input terminal configured to receive said trigger signal, and an output terminal configured to generate a delayed trigger signal.

9. The zero-crossing detection circuit of claim 7, wherein said control circuit further comprises an inverter having an input terminal coupled to said output terminal of said RS flip-flop, and an output terminal configured to generate said second switch control signal.

10. The zero-crossing detection circuit of claim 7, wherein said control circuit further comprises a second timer having an input terminal coupled to said output terminal of said RS flip-flop, and an output terminal configured to generate said first switch control signal.

11. The zero-crossing detection circuit of claim 1, wherein said main transistor is configured in a flyback switching power supply topology.

12. The zero-crossing detection circuit of claim 11, wherein said main circuit comprises:

a) a transformer having a primary winding, a secondary winding, a magnetizing inductance, and a leakage inductance, said magnetizing inductance being coupled to said primary winding, said leakage inductance having a first terminal configured to receive a DC input voltage of said main circuit, and a second terminal coupled to a first terminal of said magnetizing inductance;

b) an RCD snubber coupled to said primary winding, said RCD snubber comprising a capacitor, a resistor, and a clamping diode, wherein said capacitor and said resistor are coupled in parallel with a first common node coupled to a first terminal of said leakage inductance, and a second common node coupled to a cathode of said clamping diode, and wherein an anode of said clamping diode is coupled to a second terminal of said magnetizing inductance;

c) said secondary winding of said transformer, a freewheeling diode, and an output capacitor being coupled in a loop, wherein a load is coupled across said output capacitor; and d) said main transistor having a drain coupled to said second terminal of said magnetizing inductance, a source coupled to said zero-crossing detection circuit, and a gate coupled to a first terminal of a driving resistor, wherein a second terminal of said driving resistor is coupled to a DC voltage.

13. The zero-crossing detection circuit of claim 1, wherein a drain of said first transistor is connected to said source of said main transistor.

14. The zero-crossing detection circuit of claim 13, wherein said drain of said first transistor is directly connected to said source of said main transistor without any other devices therebetween.

15. The zero-crossing detection circuit of claim 1, wherein a gate of said main transistor is coupled to a DC voltage supply through a driving resistor.

16. The zero-crossing detection circuit of claim 15, wherein a first terminal of said driving resistor is directly connected to said DC voltage supply, and a second terminal of said driving resistor is directly connected to said gate of said main transistor.

17. The zero-crossing detection circuit of claim 1, wherein a drain of said main transistor is coupled to a transformer.

18. The zero-crossing detection circuit of claim 17, wherein said drain of said main transistor is directly connected to a primary winding of said transformer.

\* \* \* \* \*